May 27, 1969 V. UZUNOGLU 3,447,093

ADDITIVE SEMICONDUCTOR AMPLIFIER

Filed Jan. 31, 1967

INVENTOR
VASIL UZUNOGLU

BY J. O. Tresansky
ATTORNEY

1

3,447,093

ADDITIVE SEMICONDUCTOR AMPLIFIER

Vasil Uzunoglu, Southampton, Pa., assignor to the United States of America as represented by the Secretary of the Navy Filed Jan. 31, 1967, Ser. No. 613,045
Int. Cl. H01l 19/00, 3/00; H03g 3/30
U.S. Cl. 330—25 5 Claims

ABSTRACT OF THE DISCLOSURE

The subject invention essentially encompasses two main concepts, namely, the use of a double diffused integrated structure, incorporating series to shunt feedback, and the application of semiconductor transversal amplification to such a structure. An embodiment of the invention consists of an amplifier having two transistors connected in cascade. Series to shunt feedback is provided from the emitter of one to the base of the preceding transistor. One delay network is connected between the collectors of the transistors and another delay network is connected between the bases of the transistors. All the amplifier components are integrated within a semiconductor clip.

Semiconductor transversal amplification may be considered analogous to the familiar distributed type of amplification used to improve the gain-bandwidth product of amplifiers. The basic idea is to use a delay network (preferably lossless) having equally spaced taps, wherein the delay between any two successive taps is equal to $\tau$ seconds. At each tap a small portion of the signal is extracted and fed to a separate amplifier which has a phase shift corresponding to $\tau$ seconds. The outputs from the separate amplifiers are then added together to form the effective output of the system.

In the present invention each of said amplifiers comprises a single transistor and series to shunt feedback is provided, via a resistive path, from the emitter of one such transistor to the base of a transistor preceeding it. Additionally, said delay network comprises plural distinct delay networks, one of which is connected between the collectors of two adjacent transistors and another of which is connected between the bases of said two adjacent transistors.

It should be emphasized that all of the components of the instant invention, including the delay networks, the transistors and the resistive paths, are integrated within a single semiconductor chip and that a significantly improved gain-bandwidth product is effected.

The present invention relates generally to amplifying networks and more particularly to a double diffused integrated semiconductor transversal amplifier which may be used, for example, in the video frequency range.

Parallel connection of stages in conventional amplifiers, for the purpose of increasing gain, will effect higher input capacitance and cause a degradation in high-frequency response. Also, the conventionally employed feedback method suffers from the inherent disadvantage that, if a large current swing is required at the load, all the current must come from the final stage.

In accordance with the above, it should be noted that the gain-bandwidth product of a transistor is optimum for a given emitter current and that it drops at large current levels. Therefore, in trying to effect an amplifier having a high gain-bandwidth product, it is necessary to keep current levels from becoming too large.

It has been found that one efficient means of improving the gain-bandwidth product of amplifiers is to use distributed-type structures. In a distributed transistorized amplifier the output current is supplied from several transistors and each such transistor may be kept at its

2 optimum gain-bandwidth product level. Additionally, the gains of the transistors in such an amplifier are additive while their capacitances are not.

Referring now to the present invention, it will be seen that two main concepts are utilized, namely, a double diffused integrated structure, incorporating series to shunt feedback, and the application of semiconductor transversal amplification to such a structure.

Semiconductor transversal amplification may be considered analogous to the familiar distributed type of amplification used to improve the gain-bandwidth product of amplifiers. The basic idea is to use a delay line, preferably lossless, having equally spaced taps and wherein the delay between any two successive taps is equal to $\tau$ seconds. A small portion of the signal is extracted at each tap and is fed to a separate amplifier which has a phase shift corresponding to $\tau$ seconds. The outputs from the separate amplifiers are then added together to form the effective output of the system.

For simplicity, consider that first and second amplifiers are provided with each said amplifier comprising a single N-P-N transistor. In this case the series to shunt feedback mentioned hereinabove will essentially comprise a resistive feedback path between the emitter of the second amplifier transistor and the base of the first amplifier transistor (which precedes said second amplifier transistor). Such a feedback path will effect temperature compensation, signal stability and improved bandwidth. Moreover, said feedback path will supply biasing current to the base of said first amplifier transistor and thus eliminate at least one resistor which normally degrades frequency response due to its RC distributed nature.

As mentioned hereinabove, the present invention is of the integrated circuit variety and may be accomplished by growing an epitaxial layer onto an original single crystal of semiconductor material (such as a silicon chip). This epitaxial layer will be a continuation of the single crystal and its characteristics may be selected to be whatever is desired. Formed within the epitaxial layer will be diffused regions of appropriate conductivity type to form P-N junctions between such regions and the epitaxial layer, or, as the case may be, between such diffused regions themselves.

It should now be obvious that the subject invention is partly concerned with miniaturization. Also, the invention contemplates the use of a body of semiconductor material appropriately shaped, electrically and physically, and having formed therein P-N junctions, and the use of component designs for the various circuit elements or components which can be integrated into, or which constitute parts of, the aforesaid semiconductor material.

Accordingly, it is an object of the present invention to provide an amplifier having a high gain-bandwidth product, temperature compensation, and signal stability.

Another object of this invention is to provide an integrated semiconductor amplifier incorporating transversal, or additive, amplification.

A further object of the instant invention is to provide a miniature high gain-bandwidth product amplifier incorporating plural amplification stages.

A still further object of this invention is to provide a miniature, high gain-bandwidth product amplifier incorporating plural amplification stages in conjunction with series to shunt feedback.

The attendant advantages of this invention will be better appreciated and said invention will become clearly understood by reference to the following detailed description when considered in conjunction with the accompanying drawings, illustrating one embodiment of the instant invention, wherein.

Figures 1, 2:
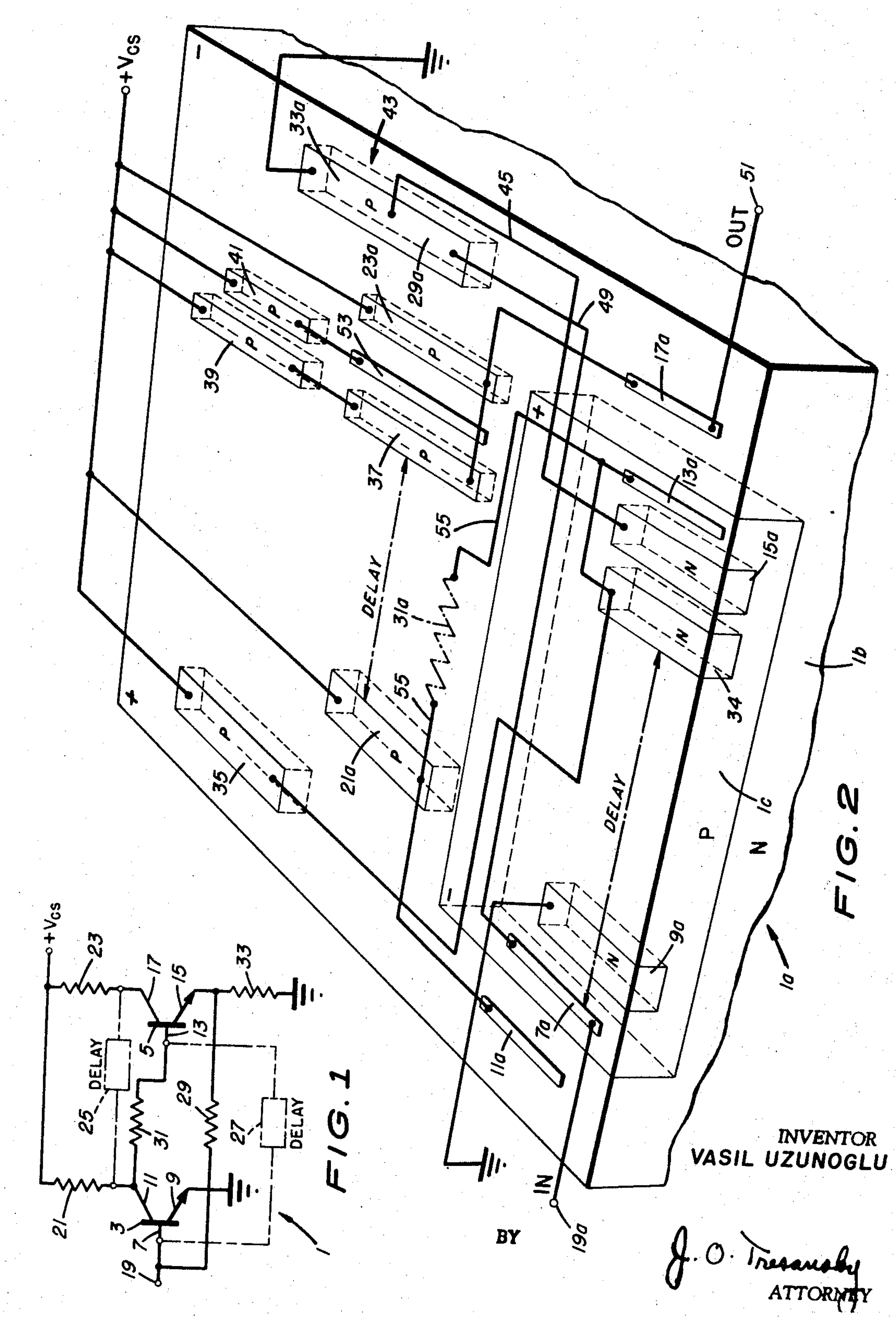
FIG. 1 is a simplified schematic of the present invention.
FIG. 2 is a simplified perspective of the subject invention showing the components thereof in similar relationship to that of FIG. 1.

Referring to the drawings in more detail, and more particularly to FIG. 1 thereof, the subject invention is shown generally at 1 and includes first and second N-P-N transistors 3 and 5, respectively. Said transistor 3 comprises a base contact 7, and emitter 9 and a collector contact 11 and said transistor 5 comprises a base contact 13, an emitter 15 and a collector contact 17.

An input terminal is shown at 19 connected to the base contact 7 of said transistor 3, whose emitter 9 is grounded. Said collector contacts 11 and 17 are connected to a positive voltage source $V_{cs}$ through resistors 21 and 23, respectively and to each other via a delay network 25. The base contact 7 of said transistor 3 is connected to the base contact 13 of said transistor 5 via a delay network 27 and a series to shunt feedback path is provided from the emitter 15 of said transistor 5 to said base contact 7 via a resistor 29.

Additionally, a forward transmission path is provided between the collector contact 11 of said transistor 3 and the base contact 13 of said transistor 5 via a resistor 31 and the emitter 15 of said transistor 5 is grounded through a resistor 33.

Now consider that an input signal is applied to the terminal 19. A portion of this signal will be amplified by the transistor 3 and will undergo a phase shift of 180°. Another portion of said input signal will be fed through the delay network 27 to the transistor 5. Said delay network 27 will delay its portion of the input signal a period $\tau$ corresponding to a phase shift of 180° and the output signal from said network 27 will be amplified by the transistor 5 and undergo another 180° phase shift.

The output signal from said transistor 3 passes through a delay network 25, where it undergoes a delay equivalent to a phase shift of 180°, to the output of said transistor 5 and combines with the output signal from said transistor 5. Additionally, it should be noted that the output from said transistor 3 will serve to bias the transistor 5 through the resistor 31.

As mentioned hereinabove, the subject invention is an integrated semiconductor device. Accordingly, it should be realized that the resistors 21, 23, 29, 31 and 33 (of FIG. 1) are not pure resistances, but rather, are of an RC distributed nature. Therefore, it should be evident that the terms impedance and resistance have not been distinguished in the above discussion.

Considering the series to shunt feedback path (through the resistor 29) mentioned supra, it should be noted that the return ratio, determined by the resistors 29 and 33, must be of such a nature that it decays with increasing frequency so that the gain remains constant. Further, it should be noted that forward transmission between the transistors 3 and 5 is negligible and, therefore, it is possible to adjust the delay (through the networks 25 and 27) independent of the amplitude characteristics.

Referring again to FIG. 2, the invention is shown in perspective at $1_a$ with the component parts thereof laid out in essentially the same relationship as in FIG. 1. A rectangular epitaxially grown layer of N-type conductivity is shown at $1_b$ which includes a diffused region $1_c$ therein of P-type conductivity. Said diffused region $1_c$ may, for example, comprise boron as a doping agent in a concentration of $5\times10^{16}$ atoms per cubic centimeter.

A plurality of spaced parallel regions $9_a$, $15_a$, and 34, of N-type conductivity, are diffused into said P-type conductivity region $1_c$ with the perpendicular distance between said parallel regions $9_a$ and 34 being 68 mils. Said region $9_a$ is grounded at one end thereof and corresponds to the emitter 9 of FIG. 1, while said region $15_a$ corresponds to the emitter 15 of FIG. 1. The diffused N-type conductivity region 34 has no counterpart in FIG. 1 and merely serves to collect delayed carriers.

Diffused into said epitaxial layer $1_b$, outwardly of said region $1_c$, are a plurality of spaced parallel rectangular regions 35, $21_a$ and 37 of P-type conductivity; the perpendicular spacing between said regions 35 and $21_a$ being 20–30 mils and that between said regions $21_a$ and 37 being 74 mils. Also diffused into said epitaxial layer $1_b$ are additional regions of P-type conductivity shown at 39, 41, $23_a$ and 43.

Said diffused region 43 is connected at one end portion thereof to ground and is tapped, at a point along its length, to one end of said diffusion $15_a$ via a thin film metallic conduction path 45. This tapping of the diffused region 43 effectively splits such region into two regions $29_a$ and $33_a$ corresponding to the resistors 29 and 33, respectively, of FIG. 1.

It should be emphasized at this point that diffused regions $21_a$, $23_a$, 35, 39, 41 and 43 comprise resistors and rest on forward biased junctions to effect low RC time constants. Further, it should be noted that electrical connections between the various elements of the integrated circuit $1_a$ are made in a well-known manner in conformity with the circuit of FIG. 1.

Referring again to FIG. 2, a plurality of narrow metallic ohmic contacts are shown at $7_a$, $11_a$, $13_a$ and $17_a$, with the contacts $7_a$ and $13_a$ resting on spaced portions of the region $1_c$ and the contacts $11_a$ and $17_a$ resting on spaced portions of the diffused region $1_b$. Accordingly, the contacts $7_a$ and $13_a$ correspond to the base contacts 7 and 13, respectively, and the contacts $11_a$ and $17_a$ correspond to the collector contacts 11 and 17, respectively, of FIG. 1. Therefore, the transistor 3 of FIG. 1, is analogous to the elements $7_a$, $9_a$ and $11_a$, of FIG. 2. The series to shunt feedback shown in FIG. 1, from the emitter contact 15 of the transistor 5 to the base contact 7 of the transistor 3, appears in FIG. 2 as the path from the diffused region $15_a$, through the conductor 45, the diffused region $29_a$ and a conductor 49, to the contact $7_a$.

As seen in FIG. 2, input and output terminals are shown at $19_a$ and 51, respectively. Said input terminal $19_a$ is connected to the contact $7_a$ and corresponds to the input terminal 19 of FIG. 1. Similarly, said output terminal 51 is connected to said contact $17_a$ and corresponds to the junction of the collector contact 17 and the resistor 23 of FIG. 1. An additional narrow metallic ohmic contact is shown at 53 secured to the surface of said epitaxial region $1_b$, between the diffusions 37 and $23_a$, and connected serially through the diffusion 41 to the voltage supply $V_{cs}$.

Referring again to FIG. 1, it will be recalled that the resistor 31, serves to bias the second stage transistor 5. Said resistor 31 appears in phantom in FIG. 2 at $31_a$ and is shown connected between said contact $13_a$ and said diffusion $21_a$ across a gap in a metallic conductor 55. It should be noted that said resistor $31_a$ does not comprise a diffusion, but rather, is inherent in the epitaxial layer $1_b$ and is an RC distributed element having associated capacitance due to the capacitance of said epitaxial layer $1_b$. The resistivity of the material comprising said resistor $31_a$ is 5 ohm-centimeters and the total resistance of resistor $31_a$ may be controlled by adjusting the length of the gap in said conductor 55.

It will be recalled that the diffused N-type conductivity region 34 serves to collect delayed carriers and it should be noted that the diffused P-type conductivity region 37 serves precisely the same function and the ohmic contact 53 serves to create a field between the diffused regions $21_a$ and 37 so that delay carriers from the region $21_a$ will reach said region 37. Also, it will be recalled that the delay networks 25 and 27 (FIG. 1) have the same delay periods.

Looking again to FIG. 2, it is seen that the delay networks 25 and 27 (of FIG. 1) do not appear as separate diffusions. Rather, said delay networks 25 and 27 are intrinsically provided by the diffusion $1_c$ and the epitaxial region $1_b$ in accordance with the teachings in the following prior art:

(1) Haynes, J. R., and W. Shockley, The Mobility and Life on Injected Holes and Elections in Germanium, Phys. Rev., vol. 81, Mar. 1, 1951, pp. 835–843.

(2) McKelvey, J. P., Diffusion Effects in Drift Mobility Measurements in Semiconductors, J. Appl. Phys., vol. 27 April 1956, pp. 341–343.

The delay network 25 (FIG. 1) is formed by the N-type conductivity epitaxial region $1_b$, between the diffusions $21_a$ and 37 (FIG. 2), and the delay network 27 (FIG. 1) is formed by the P-type conductivity diffused region $1_c$, between the base contact $7_a$ and the diffusion 34 (FIG. 2).

As mentioned hereinabove, the conductor 45 taps the diffusion 43 at a point along its length. This point is so chosen that the resistance of the diffused region $33_a$ is made equal to one tenth that of the diffused region $29_a$. Of course, the point of tapping the diffusion 43 may be varied to allow for different return ratios desired. It was also mentioned above that the diffusion 37 serves to collect delayed carriers. Accordingly, it is necessary that the bias applied to said diffusion 37 be less positive than that applied to either the diffusion $23_a$ or the contact 53. Therefore, the resistance 39 must be made larger than the resistance 41.

As is evident from FIG. 2, the epitaxial layer $1_b$ and the diffused region $1_c$ are biased in a special manner. The particular manner of biasing required for proper operation of the circuit is indicated by the "plus" and "minus" symbols shown in FIG. 2. More particularly, the epitaxial layer $1_b$ is biased so that it is more positive near the diffused region $21_a$ than near the diffused region 37; and the diffused region $1_c$ is biased so that it is more positive near the ohmic contact $13_a$ than near the ohmic contact $7_a$.

At this point it is appropriate to list the values of some of the resistors which are suitable for the embodiment (FIG. 2) of the instant invention herein described. These values are as follows:

| | Ohms |
|---|---|
| Resistor $21_a$ | 2000 |
| Resistor $23_a$ | 600–700 |
| Resistor $29_a$ | 1500–2000 |
| Resistor $33_a$ | [1] 150—200 |
| Resistor 35 | 2000–3000 |

[1] One-tenth of resistor $29_a$.

The above values are merely inserted to allow the routineer to more easily construct an operable device in accordance with the teachings herein and are not meant to be limiting. The values of those components not given are a matter of choice and are within the purview of ordinary skill in the art.

It can readily be seen that many variations and modifications of the present invention are possible in the light of the aforementioned teachings, and it will be apparent to those skilled in the art that various changes in form and arrangement of components may be made to suit requirements without departing from the spirit and scope of the invention.

I claim:

1. A double diffused integrated circuit semiconductor transversal amplifier comprising:

an epitaxial layer of semiconductive material ($1_b$) of a first type of semiconductivity;

a first region of semiconductive material ($1_c$) diffused into a portion of said epitaxial layer and being of a second type of semiconductivity opposite from said first type of semiconductivity;

a first elongated region of semiconductive material ($9_a$) diffused into a portion of said first region of semiconductive material ($1_c$) and being of said first type of semiconductivity;

a first ohmic contact ($7_a$) positioned on the surface of said first region of semiconductive material ($1_c$) and adjacent to said first elongated region of semiconductive material ($9_a$);

a second ohmic contact ($11_a$) positioned on the surface of said epitaxial layer of semiconductive material ($1_b$) and adjacent to said first ohmic contact ($7_a$);

an input terminal ($19_a$) connected to said first ohmic contact ($7_a$);

a second elongated region of semiconductive material ($15_a$) diffused into a portion of said first region of semiconductive material ($1_c$) and being of said first type of conductivity, said second elongated region of semiconductive material ($15_a$) being positioned parallel to but remote from said first elongated region of semiconductive material ($9_a$);

a third ohmic contact ($13_a$) positioned on the surface of said first region of semiconductive material ($1_c$) and adjacent to said second elongated region of semiconductive material ($15_a$);

a fourth ohmic contact ($17_a$) positioned on the surface of said epitaxial layer of semiconductive material ($1_b$) and adjacent to said third ohmic contact ($13_a$);

an output terminal (51) connected to said fourth ohmic contact ($17_a$);

a third elongated region of semiconductive material (34) diffused into a portion of said first region of semiconductive material ($1_c$) and being of said first type of conductivity, said third elongated region of semi-conductive material (34) being positioned parallel to both said first and said second elongated regions of semiconductive material ($9_a$, $15_a$), intermediate said first and second elongated regions of semiconductive material, and in closer proximity to said second elongated region of semiconductive material than to said first elongated region of semiconductive material;

a fourth elongated region of semiconductive material ($21_a$) diffused into a region of said epitaxial layer ($1_b$) and being of said second type of semiconductivity;

a fifth elongated region of semiconductive material (37) diffused into a region of said epitaxial layer ($1_b$) and being of said second type of semiconductivity, said fifth elongated region of semi-conductive material (37) being positioned parallel to but remote from said fourth elongated region of semiconductive material ($21_a$);

biasing means associated with said epitaxial layer of semiconductive material ($1_b$) and said first region of semiconductive material ($1_c$), said biasing means being of such a nature and being connected in such a manner that said first elongated region of semiconductive material ($9_a$), said first ohmic contact ($7_a$) and said second ohmic contact ($11_a$) form, respectively, the emitter, base and collector junctions of a first transistor, said second elongated region of semi-conductive material ($15_a$), said third ohmic contact ($13_a$) and said fourth ohmic contact ($17_a$) form, respectively, the emitter, base and collector junctions of a second transistor, said fourth elongated region of semiconductive material ($21_a$) and said fith elongated region of semiconductive material (37) forming a first delay line and serving to delay electrical signals passing from the collector junction of said first transistor to the collector junction of said second transistor; and said first ohmic contact ($7_a$) and said third elongated region of semiconductive material (34) forming a second delay line and serving to delay electrical signals passing from the base junction of said first transistor to the base junction of said second transistor.

2. The amplifier as recited in claim 1 and further comprising:

first resistor means ($29_a$) connected between said first ohmic contact ($7_a$) and said second elongated region of semiconductive material ($15_a$) and forming a series of shunt feedback path therebetween; and second resistor means ($31_a$) connected between said second ohmic contact ($11_a$) and said third ohmic contact ($13_a$).

3. The transversal amplifier recited in claim 1 wherein said biasing means is associated with said epitaxial layer of semiconductive material ($1_b$) and said first region of semiconductive material ($1_c$) in such a manner that the epitaxial layer is held at a potential more positive near said fourth elongated region of semiconductive material ($21_a$) than near said fifth elongated region of semiconductive material (37); and the first region of semiconductive material is held at a potential more positive near said third ohmic contact ($13_a$) than near said first ohmic contact ($7_a$).

4. The amplifier as recited in claim 3 wherein said first type of semiconductivity is the N-type of semiconductivity and the second type of semiconductivity is the P-type of semiconductivity.

5. The transversal amplifier of claim 4 wherein said epitaxial layer of semiconductive material has a resistivity of 5-ohm-centimeters and said first region of semiconductive material includes boron in a concentration of between $10^{15}$ and $10^{17}$ atoms/cc.

References Cited

UNITED STATES PATENTS 3,046,405 7/1962 Emeis.

OTHER REFERENCES

Haynes et al.: "The Mobility and Life of Injected Holes and Electrons in Germanium," Physical Review, vol. 81, no. 5, Mar. 1, 1951, pp. 835–843.

Uzunoglu: "Double Diffused Transversal Amplifiers," Proceedings of the IEEE, April 1965, pp. 410–411.

ROY LAKE, *Primary Examiner.*

J. B. MULLINS, *Assistant Examiner.*

U.S. Cl. X.R.

307—303; 317—235; 330—28, 30, 38, 151